(12) United States Patent
Lin

(10) Patent No.: US 8,941,962 B2
(45) Date of Patent: Jan. 27, 2015

(54) SNUBBER CIRCUIT AND METHOD OF USING BIPOLAR JUNCTION TRANSISTOR IN SNUBBER CIRCUIT

(75) Inventor: Kuo-Fan Lin, Taoyuan County (TW)

(73) Assignee: FSP Technology Inc., Taoyuan, Taoyuan County (TW)

( * ) Notice: Subject to any disclaimer, the term of this patent is extended or adjusted under 35 U.S.C. 154(b) by 0 days.

(21) Appl. No.: 13/610,884

(22) Filed: Sep. 12, 2012

(65) Prior Publication Data
US 2013/0063852 A1  Mar. 14, 2013

Related U.S. Application Data

(60) Provisional application No. 61/533,796, filed on Sep. 13, 2011, provisional application No. 61/682,319, filed on Aug. 13, 2012.

(30) Foreign Application Priority Data

Jan. 31, 2012 (TW) .............................. 101103040 A

(51) Int. Cl.
*H02H 3/20* (2006.01)
*H02H 9/04* (2006.01)
(Continued)

(52) U.S. Cl.
CPC .......... *H01L 23/4952* (2013.01); *H01L 23/498* (2013.01); *H01L 21/56* (2013.01); *H01L 23/62* (2013.01); *H01L 25/16* (2013.01); *H01L 24/14* (2013.01); *H01L 24/06* (2013.01); *H01L 24/49* (2013.01); *H01L 23/49562* (2013.01); *H01L 2224/16245* (2013.01); *H01L 2224/32245* (2013.01); *H01L 2224/48247* (2013.01); *H01L 2224/73265* (2013.01); *H01L 2924/13091* (2013.01); *H01L 2224/45144* (2013.01); *H01L 2924/13055* (2013.01); *H01L 2224/16106* (2013.01); *H01L 24/13* (2013.01); *H01L 24/16* (2013.01); *H01L 2224/13111* (2013.01); *H01L 2224/1403* (2013.01); *H01L 2224/14051* (2013.01); *H01L 2224/32013* (2013.01); *H01L 24/29* (2013.01); *H01L 24/32* (2013.01); *H01L 24/45* (2013.01); *H01L 24/48* (2013.01);
(Continued)

(58) Field of Classification Search
USPC ....................................................... 361/91.5
See application file for complete search history.

(56) References Cited

U.S. PATENT DOCUMENTS 5,917,241 A   6/1999  Nakayama
6,040,626 A   3/2000  Cheah
(Continued)

*Primary Examiner* — Dharti Patel
(74) *Attorney, Agent, or Firm* — Winston Hsu; Scott Margo

(57) ABSTRACT

A snubber circuit includes: at least one impedance component, a capacitor, and a Bipolar Junction Transistor (BJT). The snubber circuit is utilized for protecting electric/electronic components, reducing high frequency interference and spike voltage, and enhancing efficiency. In particular, the at least one impedance component in the snubber circuit can be at least one zener diode, where regarding protecting electric/electronic components, reducing high frequency interference and spike voltage, and enhancing efficiency, the performance of the snubber circuit in a situation where the zener diode is utilized is better than that of the snubber circuit in a situation where other types of impedance components are utilized. An associated method of using a BJT in a snubber circuit is also provided.

18 Claims, 11 Drawing Sheets

(51) Int. Cl.

| | |
|---|---|
| *H01L 23/495* | (2006.01) |
| *H01L 23/498* | (2006.01) |
| *H01L 21/56* | (2006.01) |
| *H01L 23/62* | (2006.01) |
| *H01L 25/16* | (2006.01) |
| *H01L 23/00* | (2006.01) |
| *H01L 23/31* | (2006.01) |

(52) U.S. Cl.
CPC ........ *H01L 24/73* (2013.01); *H01L 2224/0603* (2013.01); *H01L 2224/29339* (2013.01); *H01L 2224/48091* (2013.01); *H01L 2224/4813* (2013.01); *H01L 2224/49107* (2013.01); *H01L 2224/49113* (2013.01); *H01L 23/3107* (2013.01); *H01L 2924/3011* (2013.01)
USPC .......................................................... 361/91.5

(56) References Cited

U.S. PATENT DOCUMENTS

| | | | |
|---|---|---|---|
| 6,054,716 | A | 4/2000 | Sonobe |
| 6,473,318 | B1 | 10/2002 | Qian |
| 7,843,048 | B2 | 11/2010 | Galera |
| 8,324,025 | B2 | 12/2012 | Saboco |
| 2002/0079592 | A1 | 6/2002 | Lo |
| 2004/0085068 | A1* | 5/2004 | Zhu et al. ................ 324/382 |
| 2004/0240128 | A1 | 12/2004 | Boselli |
| 2008/0067601 | A1 | 3/2008 | Chen |
| 2009/0244848 | A1 | 10/2009 | Lim |
| 2009/0258458 | A1 | 10/2009 | Zhang |
| 2011/0013426 | A1* | 1/2011 | Keller ...................... 363/21.15 |
| 2011/0303947 | A1 | 12/2011 | Salcedo |
| 2012/0032319 | A1 | 2/2012 | Dunipace |
| 2012/0168839 | A1 | 7/2012 | Perng |
| 2012/0194953 | A1* | 8/2012 | Mikolajczak ................ 361/56 |

* cited by examiner

US 8,941,962 B2

SNUBBER CIRCUIT AND METHOD OF USING BIPOLAR JUNCTION TRANSISTOR IN SNUBBER CIRCUIT

CROSS REFERENCE TO RELATED APPLICATIONS

This application claims the benefit of U.S. provisional application No. 61/533,796 (filed on Sep. 13, 2011) and U.S. provisional application No. 61/682,319 (filed on Aug. 13, 2012). The entire contents of the related applications are incorporated herein by reference.

BACKGROUND OF THE INVENTION

1. Field of the Invention

The disclosed embodiments of the present invention relate to protecting circuits of power/electronic components, and more particularly, to a snubber circuit and a method for applying a bipolar junction transistor (BJT) to a snubber circuit.

2. Description of the Prior Art

As the electronic circuit technology continues to develop in recent years, various protecting circuits of power/electronic components are widely implemented in many applications. Therefore, the protecting circuit design becomes a very popular topic. In conventional protecting circuits, some snubber circuits are widely employed in power/electronic circuits due to the simple architecture and easy implementation. However, there are still disadvantages/drawbacks in these conventional snubber circuits (e.g., a RCD snubber circuit). For instance, the power consumption of the conventional snubber circuit is quite high, and the efficiency is usually poor. Moreover, the conventional snubber circuit can not ensure the restriction of the highest voltage surge. In other words, the voltage surge may exceed the range that the whole circuit can afford. As a result, the semiconductor component may be damaged due to utilizing the conventional snubber circuit.

Therefore, there is a need for a novel method to improve the circuit protection performance of the snubber circuit.

SUMMARY OF THE INVENTION

Thus, one objective of the present invention is to provide a snubber circuit and a method for applying a BJT to a snubber circuit to solve the problem mentioned above.

Another objective of the present invention is to provide a snubber circuit and a method for applying a BJT to a snubber circuit for protecting the power/electronic component, reducing high frequency interference and voltage surge, and/or improving the efficiency.

The preferred embodiment of the present invention provides a snubber circuit. The snubber circuit includes at least one impedance component, a capacitor, and a bipolar junction transistor (BJT). Specifically, the at least one impedance component in the snubber circuit is at least a zener diode, wherein the performance of the snubber circuit employing the zener diode is better than that of the snubber circuit employing other impedance component(s).

The preferred embodiment of the present invention also provides a corresponding method for applying a BJT to a snubber circuit while providing the above snubber circuit. The method includes the following steps: conducting the base and the emitter of the BJT; and based on at least one junction characteristic between the base and the collector of the BJT, utilizing the BJT as a fast diode in the snubber circuit. Specifically, the at least one junction characteristic includes a characteristic of fast turning on and a characteristic of long storage time, and the step of utilizing the BJT as a fast diode further includes: transferring the leakage-inductor energy to a capacitor of the snubber circuit rapidly by using the characteristic of fast turning on, and pushing the energy of the capacitor back to the source by using the characteristic of long storage time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
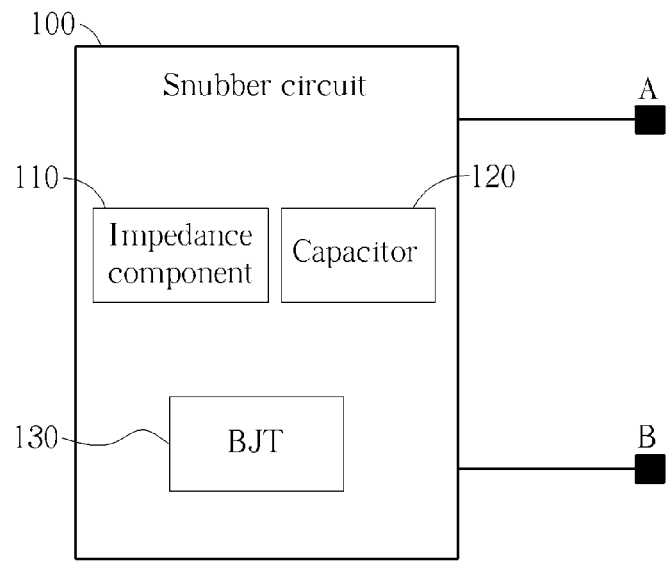
FIG. 1 is a diagram illustrating a snubber circuit according to a first embodiment of the present invention.

FIG. 1 is a diagram illustrating a snubber circuit 100 according to a first embodiment of the present invention. The snubber circuit 100 is an impedance component (e.g., a zener diode)-capacitor-bipolar junction transistor (BJT) snubber circuit. Hence, the snubber circuit 100 can be referred to as a ZCB snubber. In this embodiment, the snubber circuit 100 includes at least an impedance component 110 (e.g., at least a zener diode), a capacitor 120, and a BJT 130.

According to this embodiment, the method for applying the BJT 130 to a snubber circuit (e.g., the snubber circuit 100) may include at least the following steps: conducting the base and the emitter of the BJT; and based on at least one junction characteristic between the base and the collector of the BJT, utilizing the BJT as a fast diode in the snubber circuit. Specifically, the at least one junction characteristic includes a characteristic of fast turning on and a characteristic of long storage time, and the step of utilizing the BJT as a fast diode further includes: transferring the leakage-inductor energy to a capacitor of the snubber circuit rapidly by using the characteristic of fast turning on, pushing the energy of the capacitor back to the source by using the characteristic of long storage time, and then reducing the resonance amplitude by using the characteristic of slow switching and the characteristic of small base-collector junction capacitance $C_{bc}$. In practice, the impedance component 110 can be used to ensure the restriction of highest voltage surge and to consume the remaining energy.

According to some embodiments, such as alternative designs of the first embodiment, the at least one impedance component 110 mentioned above is at least one zener diode, wherein the performance of the snubber circuit 100 using the zener diode is better than that of the snubber circuit using other impedance component. In practice, the zener diode in the embodiments can be used to ensure the restriction of highest voltage surge and to consume the remaining energy.

FIG. 2 to FIG. 9 are diagrams showing details of different embodiments of the snubber circuit 100 in FIG. 1, wherein the embodiments in FIG. 2 to FIG. 9 correspond to type $T_A$, $T_B$, $T_C$, $T_D$, $T_E$, $T_F$, $T_G$, and $T_H$, respectively. For better understanding and clearer illustration of technical features of the present invention, the snubber circuits shown in FIG. 2 to FIG. 9 can be labeled as snubber circuits 100A, 100B, 100C, 100D, 100E, 100F, 100G, and 100H, respectively.

Figure 2:
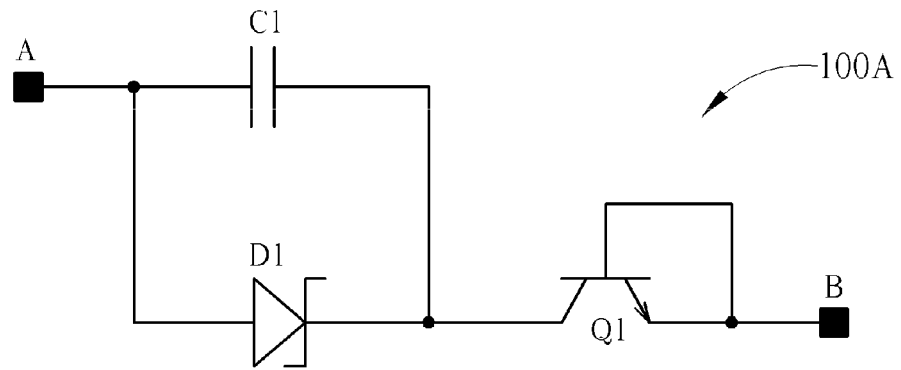
FIG. 2 is a diagram showing details of an embodiment of the snubber circuit in FIG. 1.

As shown in FIG. 2, the snubber circuit 100A includes a zener diode D1, a capacitor C1, and a BJT Q1, wherein the base and the emitter of the BJT Q1 are turned on (i.e., electrically conductive) and electrically connected to the second terminal B of the snubber circuit 100A. Two terminals of the capacitor C1 are connected to two terminals of the zener diode D1 in parallel, the collector of the BJT Q1 is electrically connected to the cathode of the zener diode D1 in series, and the anode of the zener diode D1 is electrically connected to the first terminal A of the snubber circuit 100A.

Figure 3:
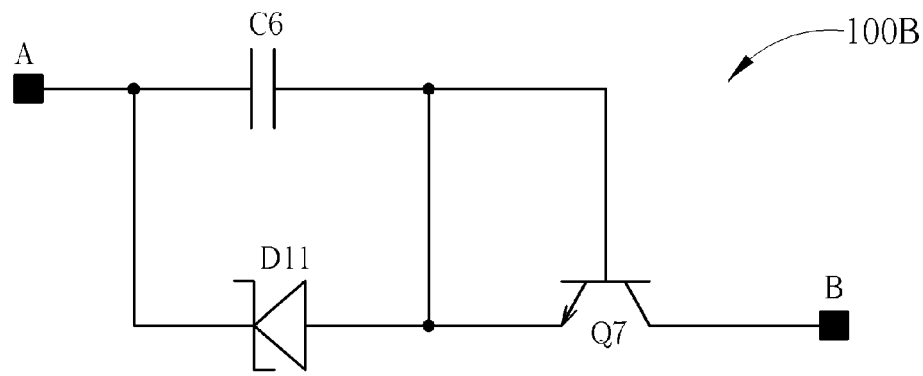
FIG. 3 is a diagram showing details of another embodiment of the snubber circuit in FIG. 1.

As shown in FIG. 3, the snubber circuit 100B includes a zener diode D11, a capacitor C6, and a BJT Q7, wherein the base and the emitter of the BJT Q7 are turned on (i.e., electrically conductive) and electrically connected to the anode of the zener diode D11 in series, and two terminals of the capacitor C6 are connected to two terminals of the zener diode D11 in parallel. The collector of the BJT Q7 is electrically connected to the second terminal B of the snubber circuit 100B, and the cathode of the zener diode D11 is electrically connected to the first terminal A of the snubber circuit 100B.

Figure 4:
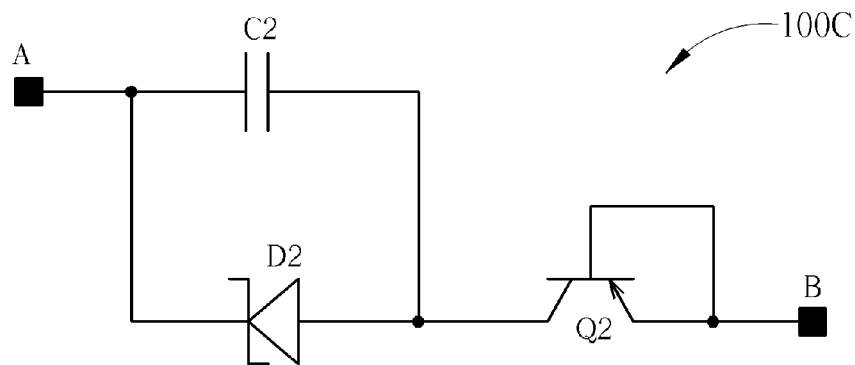
FIG. 4 is a diagram showing details of another embodiment of the snubber circuit in FIG. 1.

As shown in FIG. 4, the snubber circuit 100C includes a zener diode D2, a capacitor C2, and a BJT Q2, wherein the base and the emitter of the BJT Q2 are turned on (i.e., electrically conductive) and electrically connected to the second terminal B of the snubber circuit 100C. Two terminals of the capacitor C2 are connected to two terminals of the zener diode D2 in parallel, the collector of the BJT Q2 is electrically connected to the anode of the zener diode D2 in series, and the cathode of the zener diode D1 is electrically connected to the first terminal A of the snubber circuit 100C.

Figure 5:
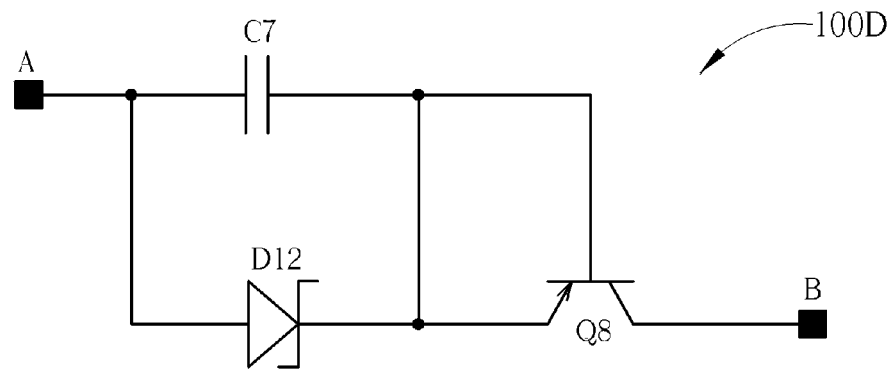
FIG. 5 is a diagram showing details of another embodiment of the snubber circuit in FIG. 1.

As shown in FIG. 5, the snubber circuit 100D includes a zener diode D12, a capacitor C7, and a BJT Q8, wherein the base and the emitter of the BJT Q8 are turned on (i.e., electrically conductive) and electrically connected to the cathode of the zener diode D12 in series, and two terminals of the capacitor C7 are connected to two terminals of the zener diode D12 in parallel. The collector of the BJT Q8 is electrically connected to the second terminal B of the snubber circuit 100D, and the anode of the zener diode D12 is electrically connected to the first terminal A of the snubber circuit 100D.

Figure 6:
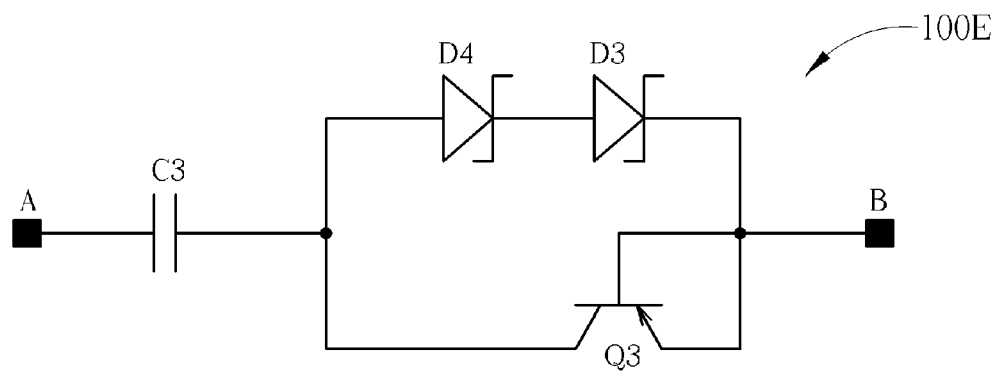
FIG. 6 is a diagram showing details of another embodiment of the snubber circuit in FIG. 1.

As shown in FIG. 6, the snubber circuit 100E includes zener diodes D3 and D4, a capacitor C3, and a BJT Q3, wherein the base and the emitter of the BJT Q3 are turned on (i.e., electrically conductive) and electrically connected to the second terminal B of the snubber circuit 100E, the collector of the BJT Q3 is electrically connected to a terminal of the capacitor C3, and another terminal of the capacitor C3 is electrically connected to the first terminal A of the snubber circuit 100E. The anode of the zener diode D3 is electrically connected to the cathode of the zener diode D4 in series, and the zener diodes D3 and D4 form a module which is connected to the emitter and the collector of the BJT Q3 through the cathode of the zener diode D3 and the anode of the zener diode D4.

Figure 7:
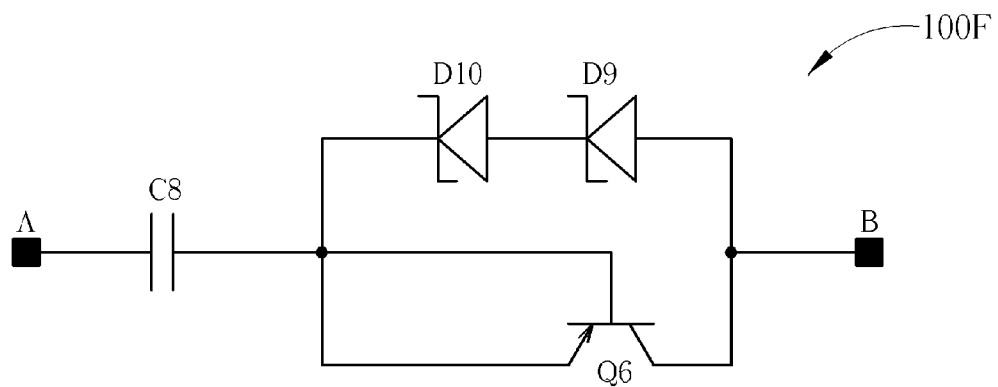
FIG. 7 is a diagram showing details of another embodiment of the snubber circuit in FIG. 1.

As shown in FIG. 7, the snubber circuit 100F includes a plurality of zener diodes D9 and D10, a capacitor C8, and a BJT Q6, wherein the base and the emitter of the BJT Q6 are turned on (i.e., electrically conductive) and electrically connected to a terminal of the capacitor C8, the collector of the BJT Q6 is electrically connected to a second terminal B of the snubber circuit 100F, and another terminal of the capacitor C8 is electrically connected to the first terminal A of the snubber circuit 100F. The anode of the zener diode D10 is electrically connected to the cathode of the zener diode D9 in series, and the zener diodes D10 and D9 form a module which is connected to the emitter and the collector of the BJT Q6 through the cathode of the zener diode D10 and the anode of the zener diode D9.

Figure 8:
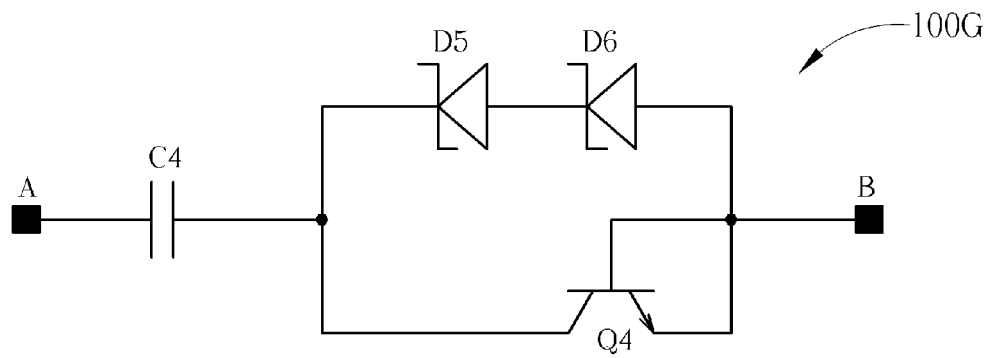
FIG. 8 is a diagram showing details of another embodiment of the snubber circuit in FIG. 1.

As shown in FIG. 8, the snubber circuit 100G includes a plurality of zener diodes D5 and D6, a capacitor C4, and a BJT Q4, wherein the base and the emitter of the BJT Q4 are turned on (i.e., electrically conductive) and electrically connected to the second terminal B of the snubber circuit 100G, the collector of the BJT Q4 is electrically connected to a terminal of the capacitor C4, and another terminal of the capacitor C4 is electrically connected to the first terminal A of the snubber circuit 100G. The anode of the zener diode D5 is electrically connected to the cathode of the zener diode D6 in series, and the zener diodes D5 and D6 form a module which is connected to the emitter and the collector of the BJT Q4 through the cathode of the zener diode D5 and the anode of the zener diode D6.

Figure 9:
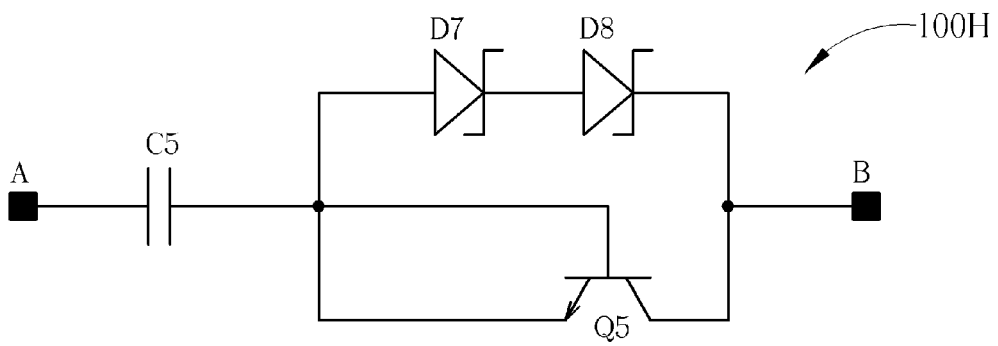
FIG. 9 is a diagram showing details of another embodiment of the snubber circuit in FIG. 1.

As shown in FIG. 9, the snubber circuit 100H includes a plurality of zener diodes D7 and D8, a capacitor C5, and a BJT Q5, wherein the base and the emitter of the BJT Q5 are turned on (i.e., electrically conductive) and electrically connected to a terminal of the capacitor C5, the collector of the BJT Q5 is electrically connected to a second terminal B of the snubber circuit 100H, and another terminal of the capacitor C5 is electrically connected to the first terminal A of the snubber circuit 100H. The anode of the zener diode D8 is electrically connected to the cathode of the zener diode D7 in series, and the zener diodes D8 and D7 form a module which is connected to the emitter and the collector of the BJT Q5 through the cathode of the zener diode D8 and the anode of the zener diode D7.

Figure 10:
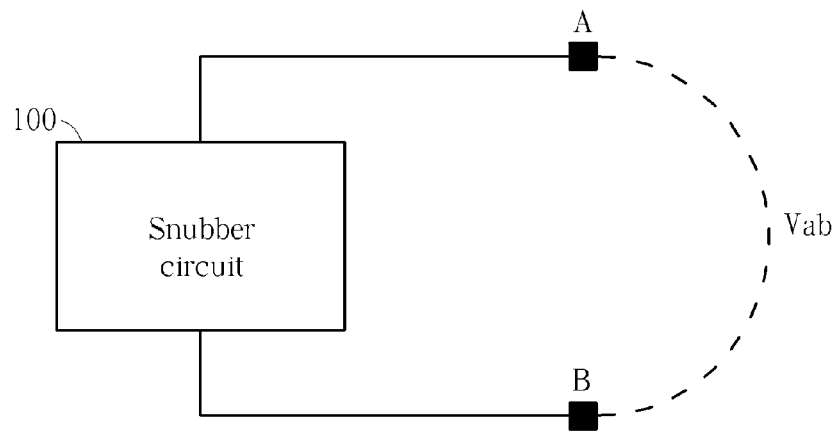
FIG. 10 is a diagram illustrating the related voltage of the snubber circuit shown in FIG. 1 in some embodiments of the present invention.

FIG. 10 is a diagram illustrating the related voltage Vab (i.e., the voltage across the terminal A and the terminal B) of the snubber circuit 100 shown in FIG. 1 in some embodiments of the present invention, such as the above mentioned embodiments. The snubber circuit 100 can adjust the voltage Vab dynamically. The snubber circuit 100 may use the BJT 130 as a fast diode according to the at least one junction characteristic mentioned above. Especially, the snubber circuit 100 may transfer the leakage inductor energy to a capacitor of the snubber circuit rapidly by using the characteristic of fast turning on, push the energy of the capacitor back to the source by using the characteristic of long storage time, and reduce the resonance amplitude by using the characteristic of slow switching and the characteristic of small base-emitter junction capacitance $C_{bc}$. The impedance component 110 (e.g., the zener diode D1, D2, D3, D4, D5, D6, D7, D8, D9, D10, D11, D12) can be used to ensure the restriction of highest voltage surge and to consume the remaining energy.

FIG. 11 to FIG. 14 are diagrams illustrating curves of the voltage Vab to time t in different embodiments of the present invention, wherein the embodiments in FIG. 11 to FIG. 14 correspond to conditions $CS_1$, $CS_2$, $CS_3$ and $CS_4$, respectively.

Figure 11:
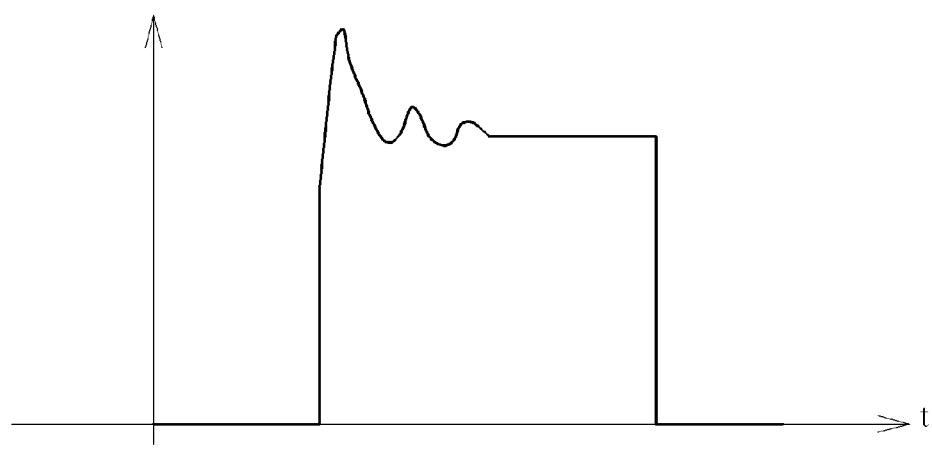
FIG. 11 is a diagram illustrating the curve of the voltage to time in an embodiment of the present invention.

According to the embodiment of FIG. 11, the condition $CS_1$ represents that the voltage Vab can be greater or equal to zero, and the voltage surge may arise at the condition that the voltage Vab is greater than zero, wherein the snubber circuits 100E and 100H are applicable to condition $CS_1$.

Figure 12:
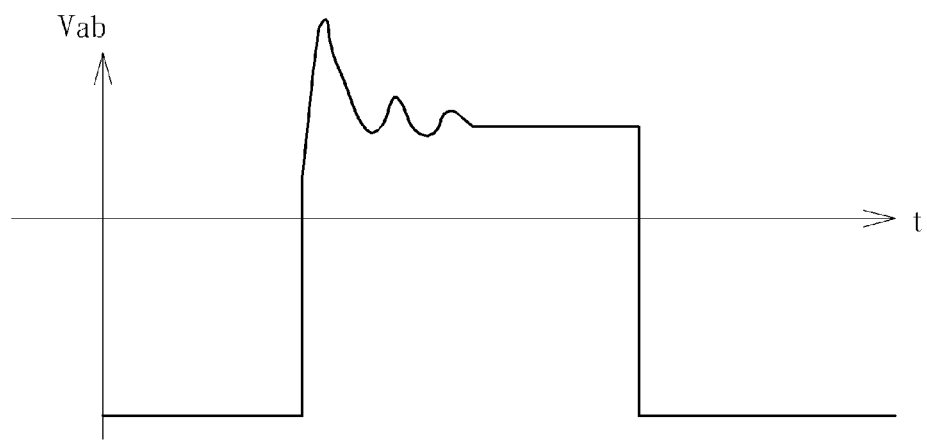
FIG. 12 is a diagram illustrating the curve of the voltage to time in another embodiment of the present invention.

According to the embodiment of FIG. 12, the condition $CS_2$ represents the voltage Vab can switch between positive and negative values, and the voltage surge may arise at the condition that the voltage Vab is greater than zero (especially the voltage surge immediately follows the rising edge of the voltage Vab), wherein the snubber circuits 100B and 100C are applicable to condition $CS_2$.

Figure 13:
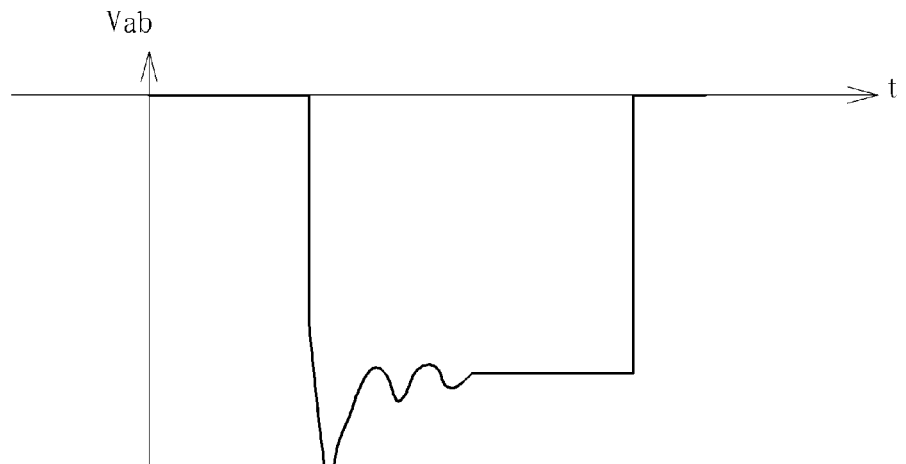
FIG. 13 is a diagram illustrating the curve of the voltage to time in another embodiment of the present invention.

According to the embodiment of FIG. 13, the condition $CS_3$ represents that the voltage Vab can be smaller or equal to zero, and the voltage surge may arise at the condition that the voltage Vab is smaller than zero, wherein the snubber circuits 100F and 100G are applicable to condition $CS_3$.

Figure 14:
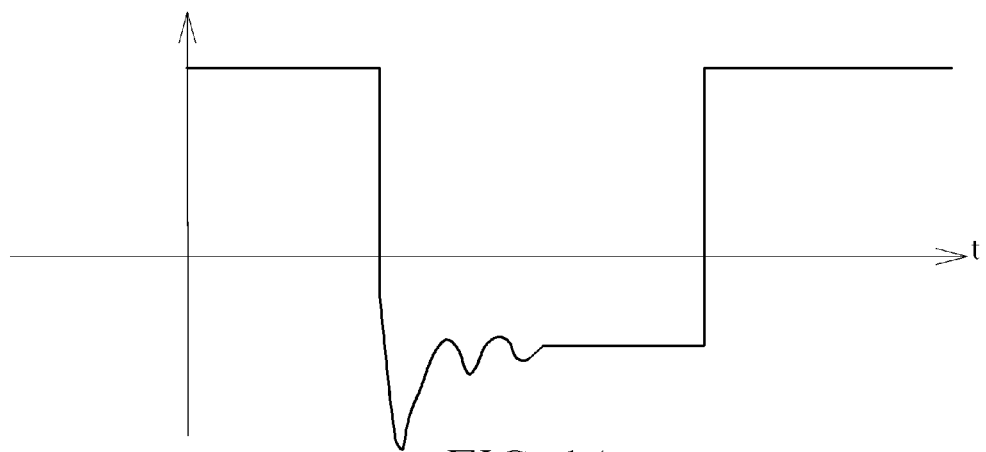
FIG. 14 is a diagram illustrating the curve of the voltage to time in another embodiment of the present invention.

According to the embodiment of FIG. 14, the condition $CS_4$ represents that the voltage Vab can switch between positive and negative values, and the voltage surge may arise at the condition that the voltage Vab is smaller than zero (especially the voltage surge immediately follows the falling edge of the voltage Vab), wherein the snubber circuits 100A and 100D are applicable to condition $CS_4$.

Figure 15:
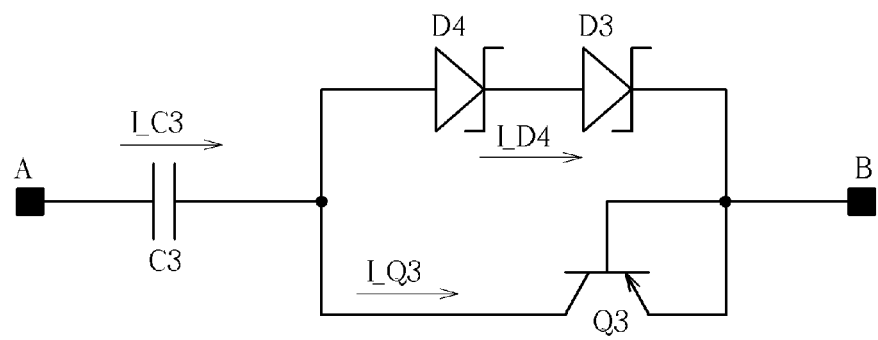
FIG. 15 is a diagram illustrating the snubber circuit shown is FIG. 6 operating at one condition according to an exemplary embodiment of the present invention.
Figure 16:
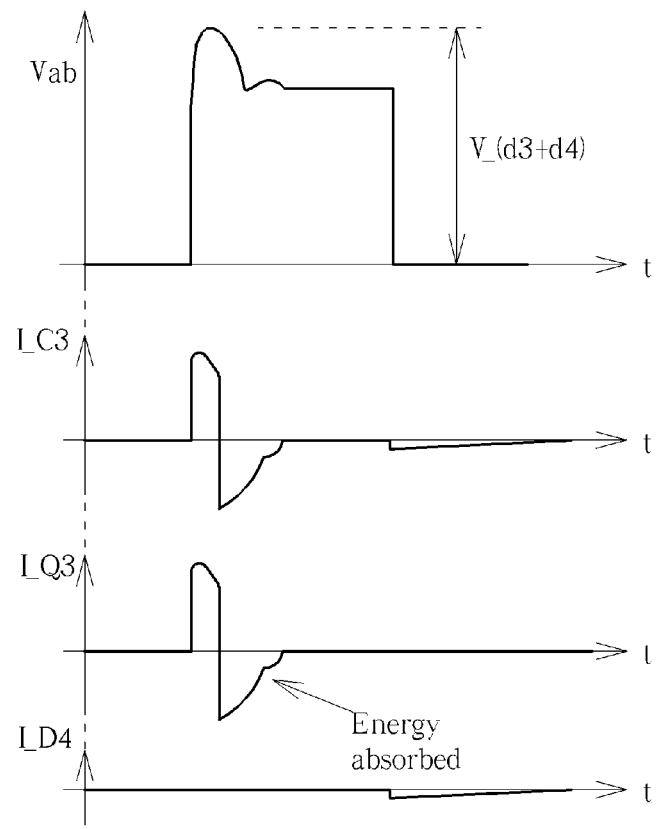
FIG. 16 is a diagram illustrating the related characteristic curves of the snubber circuit in the embodiment of FIG. 15.

FIG. 15 is a diagram illustrating the snubber circuit 100E shown in FIG. 6 operating under the condition $CS_1$ according to an exemplary embodiment of the present invention, and FIG. 16 is a diagram illustrating related characteristic curves of the snubber circuit 100E in the embodiment of FIG. 15, wherein the symbols I_C3, I_D4, and I_Q3 represent the current flowing through the capacitor C3, the zener diode D4, and the BJT Q3, respectively. In this embodiment, the snubber circuit 100E ensures the restriction of the highest voltage surge. Especially, the snubber circuit 100E ensures that the maximum value of the voltage surge does not exceed V_(d3_d4) (i.e., the summation of the breakdown voltage V_D3 of the zener diode D3 and the breakdown voltage V_D4 of the zener diode D4).

Figure 17:
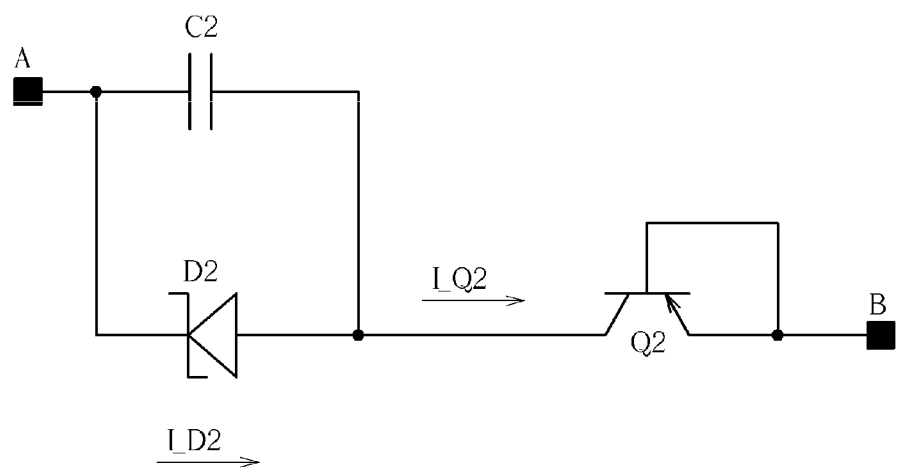
FIG. 17 is a diagram illustrating the snubber circuit shown is FIG. 6 operating at another condition according to an exemplary embodiment of the present invention.
Figure 18:
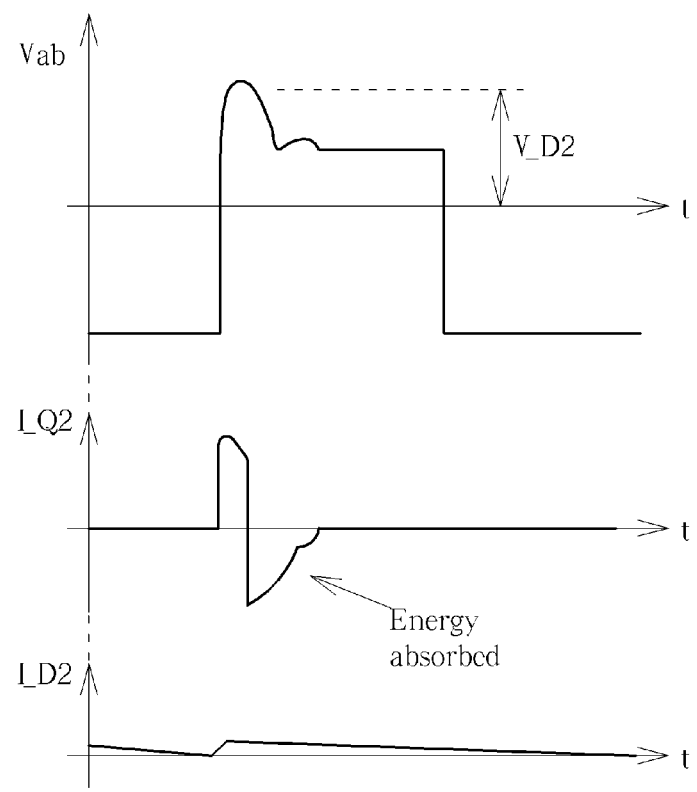
FIG. 18 is a diagram illustrating the related characteristic curves of the snubber circuit in the embodiment of FIG. 15.

FIG. 17 is a diagram illustrating the snubber circuit 100C shown is FIG. 4 operating under the condition $CS_2$ according to an exemplary embodiment of the present invention, and FIG. 18 is a diagram illustrating the related characteristic curves of the snubber circuit 100C in the embodiment of FIG. 17, wherein the symbols I_D2 and I_Q2 represent the current flowing through the zener diode D2 and the BJT Q2, respectively. In this embodiment, the snubber circuit 100C ensures the restriction of the highest voltage surge. Especially, the snubber circuit 100C ensures that the maximum value of the voltage surge does not exceed V_D2 (i.e., the breakdown voltage of the zener diode D2).

FIG. 19-FIG. 22 are diagrams illustrating four different types $TYPE_1$, $TYPE_2$, $TYPE_3$, and $TYPE_4$ of a snubber circuit 200 according to a second embodiment of the present invention, in which the snubber circuit 200 is a capacitor-BJT snubber circuit and may be referred to as a CB snubber. In the second embodiment, the snubber circuit 200 includes a capacitor 120 and a BJT 130 (especially, the aforementioned impedance component(s) are not needed here). The operational details of the four different types $TYPE_1$, $TYPE_2$, $TYPE_3$, and $TYPE_4$ of the snubber circuit 200 are shown in FIG. 19-FIG. 22, respectively. For better understanding and clearer illustration of technical features of the present invention, the snubber circuits shown in FIG. 19-FIG. 22 may be referred to as snubber circuits 200A, 200B, 200C, and 200D, respectively.

Figure 19:
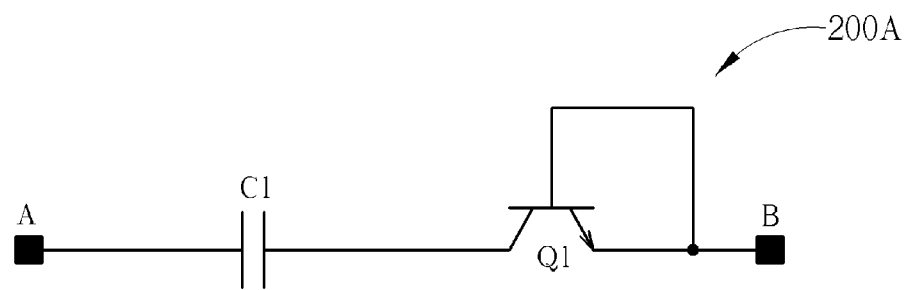
FIG. 19 is a diagram illustrating a type of a snubber circuit according to an embodiment of the present invention.

As shown in FIG. 19, the zener diode D1 is removed from the snubber circuit 100A in FIG. 2, and the snubber circuit 200A includes a capacitor C1 and a BJT Q1, wherein the base and the emitter of the BJT Q1 are turned on (i.e., electrically conductive) and electrically connected to a second terminal B of the snubber circuit 200A, the collector of the BJT Q1 is electrically connected to a terminal of the capacitor C1, and another terminal of the capacitor C1 is electrically connected to a first terminal A of the snubber circuit 200A.

Figure 20:
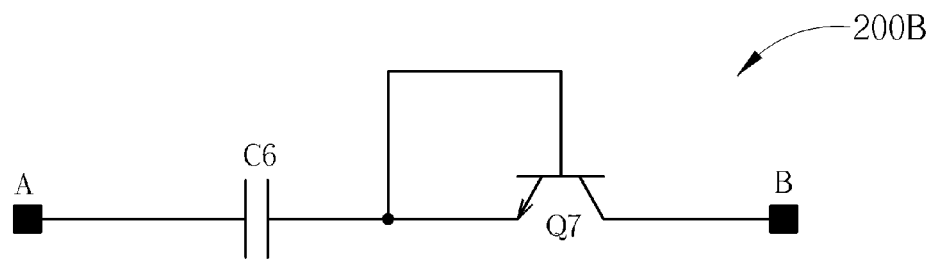
FIG. 20 is a diagram illustrating another type of a snubber circuit according to another embodiment of the present invention.

As shown in FIG. 20, the zener diode D11 is removed from the snubber circuit 100B in FIG. 3, and the snubber circuit 200B includes a capacitor C6 and a BJT Q7, wherein the base and the emitter of the BJT Q7 are turned on (i.e., electrically conductive) and electrically connected to a terminal of the capacitor C6, the collector of the BJT Q7 is electrically connected to a second terminal B of the snubber circuit 200B, and another terminal of the capacitor C6 is electrically connected to a first terminal A of the snubber circuit 200B.

Figure 21:
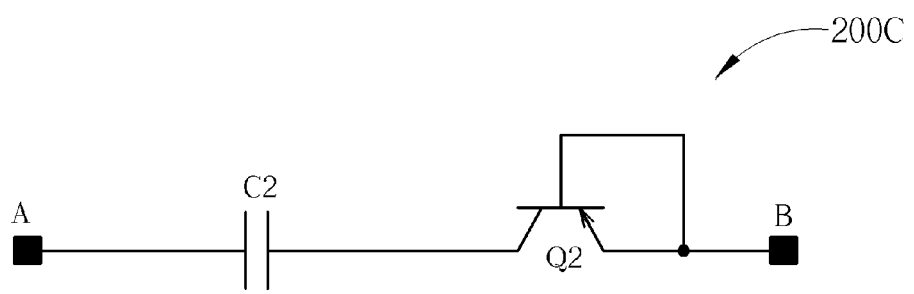
FIG. 21 is a diagram illustrating another type of a snubber circuit according to another embodiment of the present invention.

As shown in FIG. 21, the zener diode D2 is removed from the snubber circuit 100C in FIG. 4, and the snubber circuit 200C includes a capacitor C2 and a BJT Q2, wherein the base and the emitter of the BJT Q2 are turned on (i.e., electrically conductive) and electrically connected to a second terminal B of the snubber circuit 200C, the collector of the BJT Q2 is electrically connected to a terminal of the capacitor C2, and another terminal of the capacitor C2 is electrically connected to a first terminal A of the snubber circuit 200C.

Figure 22:
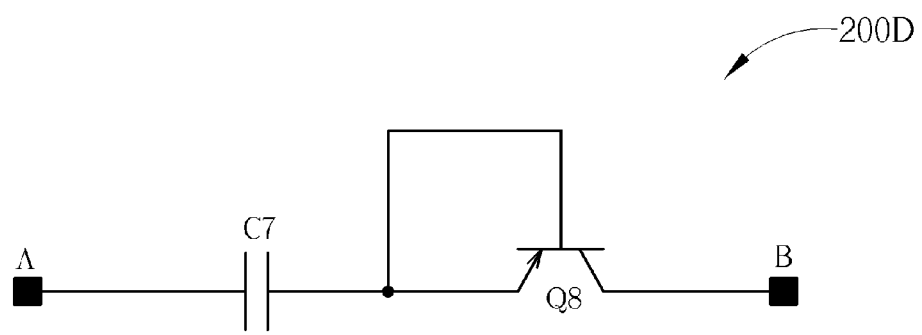
FIG. 22 is a diagram illustrating another type of a snubber circuit according to another embodiment of the present invention.

As shown in FIG. 22, the zener diode D12 is removed from the snubber circuit 100D in FIG. 5, and the snubber circuit 200D includes a capacitor C7 and a BJT Q8, wherein the base and the emitter of the BJT Q8 are turned on (i.e., electrically conductive) and electrically connected to a terminal of the capacitor C7, the collector of the BJT Q8 is electrically connected to a second terminal B of the snubber circuit 200D, and another terminal of the capacitor C7 is electrically connected to a first terminal A of the snubber circuit 200D.

The first embodiment and the second embodiment of the snubber circuits 100A-100H, 200A-200D mentioned above are connected to an active component or a load in parallel, wherein the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

Figure 23:
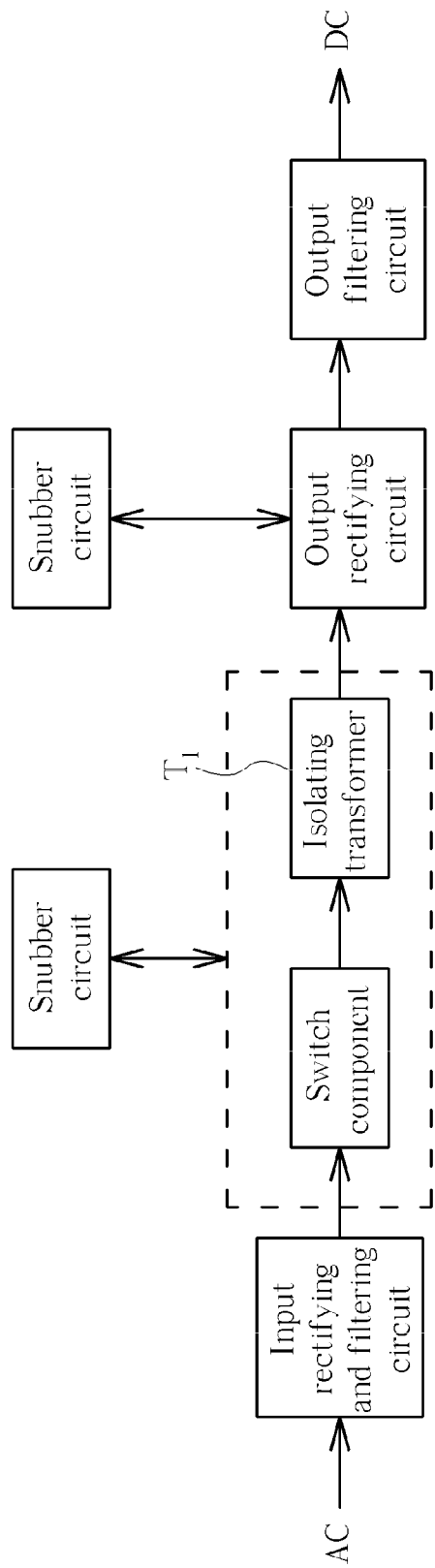
FIG. 23 is a diagram illustrating a switch power supply of the snubber circuits of embodiments.

FIG. 23 is a diagram illustrating a switch power supply of the aforementioned snubber circuit, for example, the ZCB snubber or the CB snubber according to an embodiment of the present invention, in which the switch power supply includes an input rectifying and filtering circuit, a switch component, an isolating transformer $T_1$, an output rectifying circuit, and an output filtering circuit, and further includes at least a portion of a plurality of snubber circuits 100A-100H, 200A-200D. In FIG. 23, the symbol AC at the lower left corner indicates an alternating current (AC) input, and the symbol DC at the lower right corner indicates a direct current (DC) output.

Figure 24:
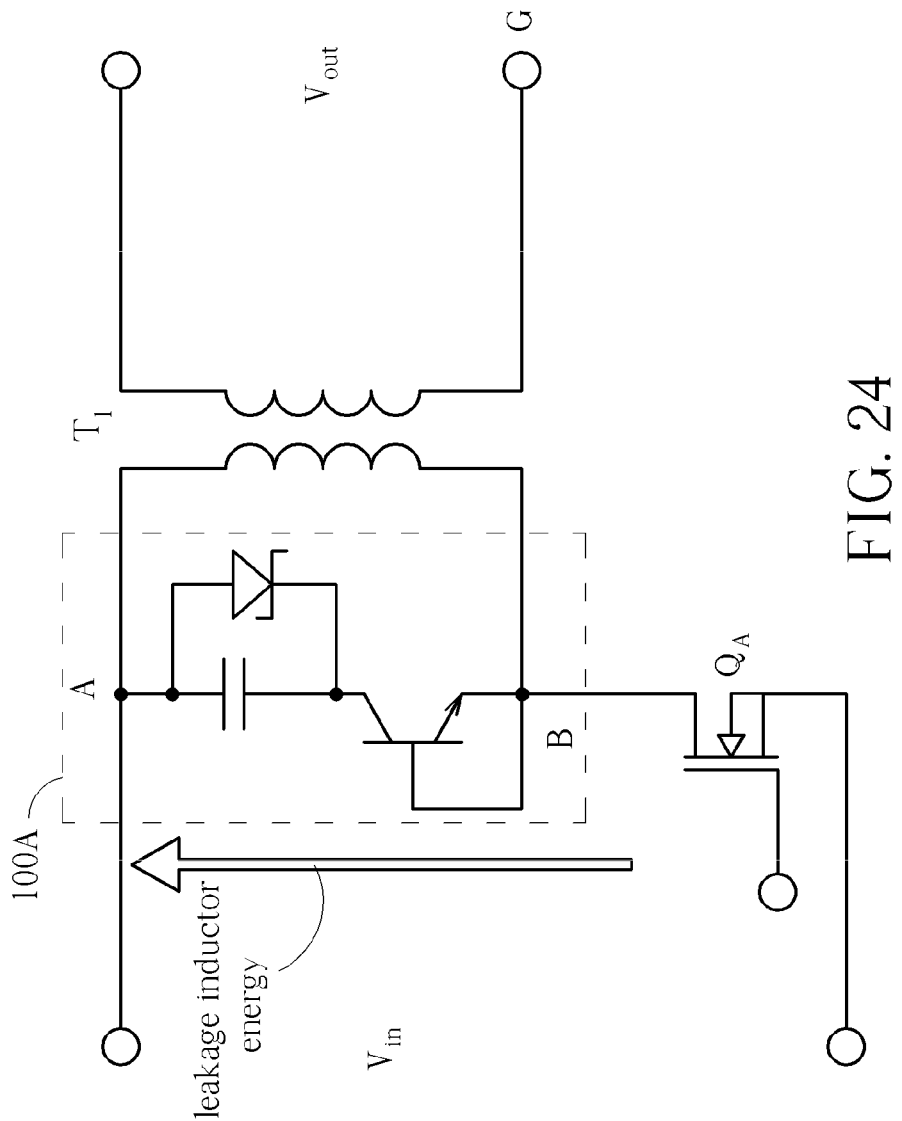
FIG. 24 is a diagram illustrating a configuration scheme of the snubber circuit shown in FIG. 2 for setting the snubber circuit at the primary side of the isolating transformer of the switch power supply shown in FIG. 23 according to an embodiment of the present invention.

FIG. 24 is a diagram illustrating a configuration scheme of the snubber circuit 100A shown in FIG. 2 for setting the snubber circuit at the primary side of the isolating transformer $T_1$ of the switch power supply shown in FIG. 23, wherein the configuration scheme corresponds to the type $T_A$. In FIG. 24, symbol G indicates the ground terminal, and the symbols $V_{in}$ and $V_{out}$ indicate the input voltage and the output voltage, respectively. For better understanding of technical features of the present invention, FIG. 24 uses the snubber circuit 100A corresponding to the type $T_A$ as an example. However, this is for illustrative purposes only, and is not meant to be a limitation of the present invention. The configuration scheme may be modified, wherein other snubber circuits corresponding to other types $T_B$, $T_C$, $T_D$, $T_E$, $T_F$, $T_G$, $T_H$, TYPE$_1$, TYPE$_2$, TYPE$_3$, and TYPE$_4$ may be employed according to different configuration schemes. For example, in a condition that the snubber circuit 100G corresponding to the type $T_G$ is employed, the circuit between the terminals A and B in FIG. 24 may be replaced by the circuit shown in FIG. 8. In another condition that the snubber circuit 200A corresponding to the type TYPE$_1$ is employed, the circuit between the terminals A and B in FIG. 24 may be replaced by the circuit shown in FIG. 19.

According to this embodiment, the snubber circuit 100A may be set at the primary side of the isolating transformer $T_1$ of the switch power supply. Especially, the snubber circuit 100A may be connected to the isolating transformer $T_1$ in parallel, and may be connected to at least one switching component (e.g., the switching component shown in FIG. 23) of the switch power supply in series. In addition, the switching component may be a switch. In this embodiment, the switch may be, for example, a MOSFET $Q_4$. However, this is for illustrative purposes only, and is not meant to be a limitation of the present invention. In accordance with some of the modifications of this embodiment, the switch may be a diode (which may replace the MOSFET $Q_4$ in the alternative designs). For example, based on the voltage-current characteristic of the diode, the diode could be turned on or turned off automatically in accordance with the cross voltage of the diode, and thus may be regarded as an automatic switch. The setting direction of two terminals of the diode depends on different configurations. In accordance with some of the modifications of this embodiment, the switch may be or may be assembled by a Bipolar Junction Transistor (BJT), an Insulated Gate Bipolar Transistor (IGBT), a Static Induction Transistor (SIT), or a thyristor (which could replace the MOSFET $Q_4$).

In this embodiment, the first terminal A of the snubber circuit 100A is electrically connected to a terminal of the primary side of the isolating transformer $T_1$, and the other terminal B is electrically connected to another terminal of the primary side of the isolating transformer $T_1$ and the switching components such as aforementioned switch (e.g., MOSFET $Q_4$), and the energy generated by the switch while switching at high frequency may be absorbed by the snubber circuit 100A for energy recycling. Especially, the snubber circuit 100A may utilize at least one of the aforementioned junction characteristic to perform the aforementioned energy recycling process. For instance, the snubber circuit 100A may transfer the leakage inductor energy to the capacitor 120 rapidly by using the characteristic of fast turning on, and push the energy of the capacitor 120 back to the source by using the characteristic of long storage time. Please note that before the above-mentioned energy recycling process, the snubber circuit 100A may reduce the resonance amplitude by using the characteristic of slow switching and the characteristic of small base-emitter junction capacitance $C_{bc}$. Therefore, the snubber circuit 100A could reduce the spike voltage and work efficiently.

Figure 25:
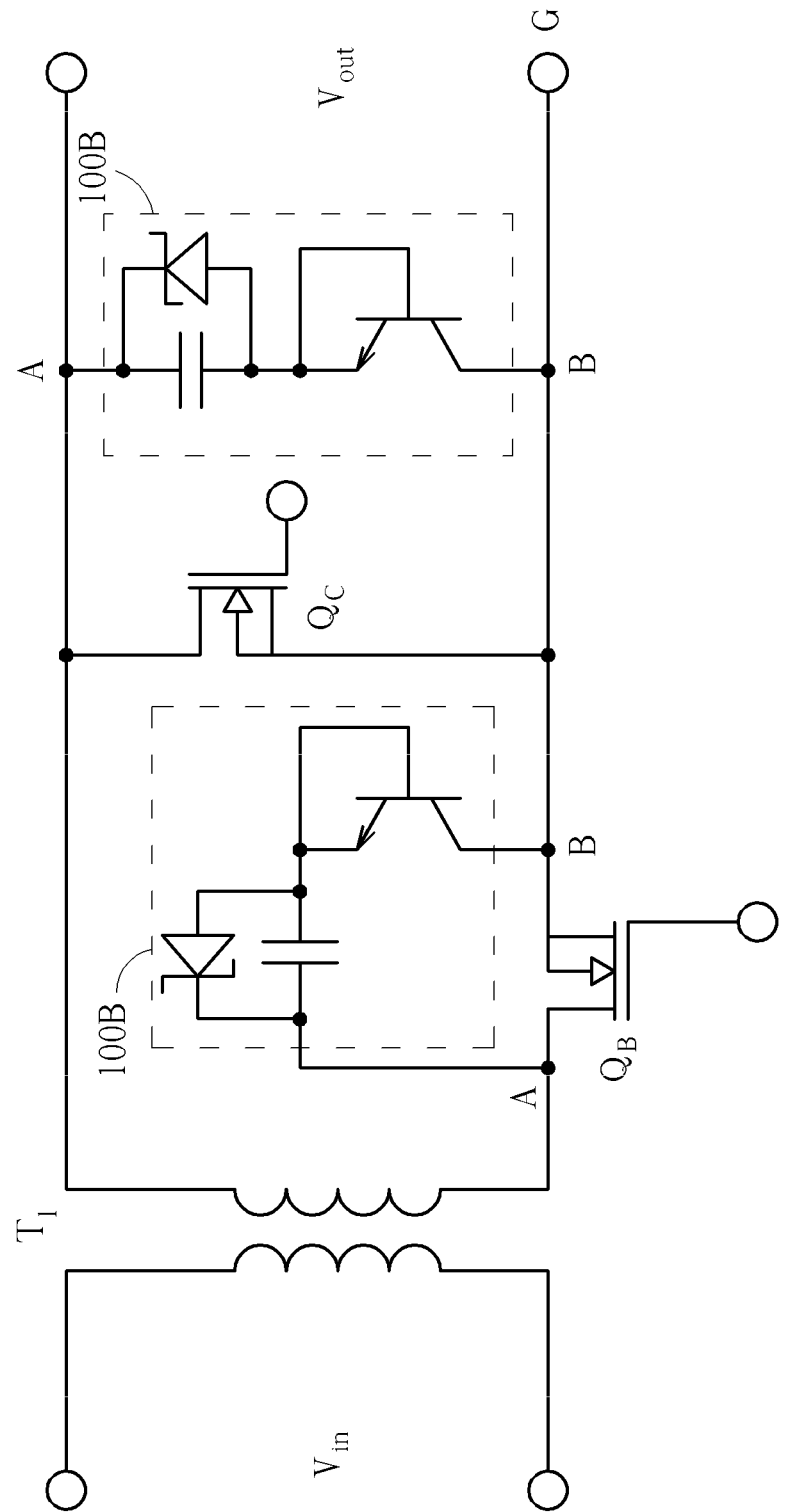
FIG. 25 is a diagram illustrating a configuration scheme of the snubber circuit shown in FIG. 2 for setting the snubber circuit at the secondary side of the isolating transformer of the switch power supply shown in FIG. 23 according to another embodiment of the present invention.

FIG. 25 is a diagram illustrating a configuration scheme of the snubber circuit 100B shown in FIG. 3 for setting the snubber circuit at the secondary side of the isolating transformer $T_1$ of the switch power supply shown in FIG. 23, wherein the configuration scheme corresponds to the type $T_B$. In FIG. 25, similarly, symbol G indicates the ground terminal, and the symbols $V_{in}$ and $V_{out}$ indicate the input voltage and the output voltage, respectively. For better understanding of technical features of the present invention, FIG. 25 uses the snubber circuit 100B corresponding to the type $T_B$ as an example. However, this is for illustrative purposes only, and is not meant to be a limitation of the present invention. The configuration scheme may be modified, wherein other snubber circuits corresponding to other types $T_A$, $T_C$, $T_D$, $T_E$, $T_F$, $T_G$, $T_H$, TYPE$_1$, TYPE$_2$, TYPE$_3$, and TYPE$_4$ may be employed according to different configuration schemes. For instance, in a condition that the snubber circuit 100H corresponding to the type $T_H$ is employed, the circuit between the terminals A and B in FIG. 25 may be replaced by the circuit shown in FIG. 9. In another condition that the snubber circuit 200B corresponding to the type TYPE$_2$ is employed, the circuit between the terminals A and B in FIG. 25 may be replaced by the circuit shown in FIG. 20.

According to this embodiment, the snubber circuit 100B may be set at the secondary side of the isolating transformer $T_1$ of the switch power supply. Especially, when the snubber circuit 100B (corresponding to the type $T_B$) is set at the secondary side of the isolating transformer $T_1$, the snubber circuit 100B may be connected to a switch of the output integrating circuit shown in FIG. 23 in parallel. Hence, the energy generated by the switch while switching at high frequency may be absorbed by the snubber circuit 100B to exploit the at least one junction characteristic mentioned above for energy recycling. For instance, the snubber circuit 100B may be connected to the MOSFET $Q_B$ in parallel to thereby protect the MOSFET $Q_B$ from spike voltage, and provide efficient operation in the condition that the switch is a MOSFET $Q_B$. Alternatively, the snubber circuit 100B may be connected to the MOSFET $Q_C$ in parallel to protect the MOSFET $Q_C$ from spike voltage, and provide efficient operation in the condition that the switch is a MOSFET $Q_C$. This is for illustrative purposes only, and is not meant to be a limitation of the present invention. In accordance with some of the modifications of the embodiment, the switch may be a diode (which may replace the MOSFET $Q_B$ or MOSFET $Q_C$ in alternative designs). For example, based on the voltage-current characteristic of the diode, the diode could be turned on or turned off automatically in accordance with the cross voltage of the diode, and thus may be regarded as an automatic switch. The setting direction of two terminals of the diode depends on different configurations. In accordance with some of the modifications of this embodiment, the switch may be or may be assembled by a Bipolar Junction Transistor (BJT), an Insulated Gate Bipolar Transistor (IGBT), a Static Induction Transistor (SIT), or a thyristor (which may replace the MOSFET $Q_B$ or MOSFET $Q_C$ in the modifications).

One of the advantages of the present invention is that the architecture of the snubber circuit in the present invention is simple and easy to implement, and the related technical problems can be avoided. In addition, the snubber circuit of the present invention may be connected to an active component or a load in parallel to protect the circuit connected to the load. For example, the proposed snubber circuit may be set in a switch power supply to protect the switching components connected to the primary side or the output rectifying circuit connected to the secondary side of the transformer. The snubber circuit especially can absorb the energy generated by the active component while switching at high frequency, provide excellent efficiency, and ensure the highest voltage surge to provide the best protection for a variety of electric/electronic components (e.g., semiconductor components).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A snubber circuit, comprising:
   at least one impedance component;
   a capacitor, having a first terminal and a second terminal, wherein the first terminal of the capacitor is electrically connected to a first terminal of the snubber circuit; and
   a bipolar junction transistor (BJT), wherein one of an emitter and a collector of the BJT is electrically connected to the second terminal of the capacitor, another of the emitter and the collector of the BJT is electrically connected to a second terminal of the snubber circuit, and a base of the BJT is electrically connected to the emitter of the BJT;
   wherein the at least one impedance component is connected to the capacitor in parallel, or connected to the emitter and the collector of the BJT in parallel; and the snubber circuit transfers leakage inductor energy to the capacitor rapidly and pushes energy of the capacitor back to a source for energy recycling.

2. The snubber circuit in claim 1, wherein the at least one impedance component is at least a zener diode.

3. The snubber circuit in claim 1, wherein based on at least one junction characteristic between the base and the collector of the BJT, the snubber circuit utilizes the BJT as a fast diode.

4. The snubber circuit in claim 3, wherein the at least one junction characteristic includes a characteristic of fast turning on and a characteristic of long storage time, and the snubber circuit transfers the leakage inductor energy to the capacitor rapidly by using the characteristic of fast turning on, and pushes the energy of the capacitor back to the source by using the characteristic of long storage time.

5. The snubber circuit in claim 4, wherein the at least one junction characteristic further including a characteristic of switching slowly and a characteristic of small base-collector junction capacitance, and the snubber circuit reduces the resonance amplitude by using the characteristic of switching slowly and the characteristic of small base-collector junction capacitance.

6. The snubber circuit in claim 5, wherein the at least one impedance component is used to ensure restriction of highest voltage surge and to consume remaining energy.

7. The snubber circuit in claim 5, wherein the at least one impedance component is at least one zener diode; and the at least one zener diode is used to ensure restriction of highest voltage surge and to consume remaining energy.

8. The snubber circuit in claim 1, wherein the snubber circuit is connected to an active component or a load in parallel, the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

9. The snubber circuit in claim 8, wherein when the snubber circuit is set at a primary side of a transformer, the snubber circuit is connected to the primary side of transformer in parallel and connected to at least a switch in series.

10. The snubber circuit in claim 8, wherein when the snubber circuit is set at a secondary side of a transformer, the snubber circuit is connected to a switch of an output rectifying circuit in parallel.

11. A method for applying a bipolar junction transistor (BJT) to a snubber circuit, the method comprising:
    electrically connecting a base of the BJT to an emitter of the BJT;
    based on at least one junction characteristic between the base and the collector of the BJT, utilizing the BJT as a fast diode in the snubber circuit; and
    transferring leakage inductor energy to a capacitor of the snubber circuit rapidly, and pushing energy of the capacitor back to a source for energy recycling.

12. The method of claim 11, wherein the at least one junction characteristic includes a characteristic of fast turning on, a characteristic of long storage time, a characteristic of slow switching, and a characteristic of small base-collector junction capacitance; and the step of utilizing the BJT as the fast diode further comprises:
    transferring leakage inductor the energy to the capacitor of the snubber circuit rapidly by using the characteristic of fast turning on, and pushing the energy of the capacitor back to the source by using the characteristic of long storage time; and
    reducing a resonance amplitude by using the characteristic of slow switching and the characteristic of small base-collector junction capacitance.

13. The method of claim 12, further comprising:
    utilizing at least one impedance component to ensure restriction of highest voltage surge and to consume remaining energy.

14. The method of claim 12, further comprising:
utilizing at least one zener diode to ensure restriction of highest voltage surge and to consume remaining energy.

15. A snubber circuit, comprising:
a capacitor, having a first terminal and a second terminal, wherein the first terminal of the capacitor is electrically connected to a first terminal of the snubber circuit; and
a bipolar junction transistor (BJT), wherein one of an emitter and a collector of the BJT is electrically connected to the second terminal of the capacitor, another of the emitter and the collector of the BJT is electrically connected to a second terminal of the snubber circuit, and a base of the BJT is electrically connected to the emitter of the BJT;
wherein the snubber circuit transfers leakage inductor energy to the capacitor rapidly and pushes energy of the capacitor back to a source for energy recycling.

16. The snubber circuit in claim 15, wherein the snubber circuit is connected to an active component or a load in parallel, the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

17. The snubber circuit in claim 16, wherein when the snubber circuit is set at a primary side of a transformer, the snubber circuit is connected to the primary side of transformer in parallel and connected to at least a switch in series.

18. The snubber circuit in claim 16, wherein when the snubber circuit is set at a secondary side of a transformer, the snubber circuit is connected to a switch of an output rectifying circuit in parallel.

* * * * *